US009666395B2

(12) United States Patent
Watari et al.

(10) Patent No.: US 9,666,395 B2
(45) Date of Patent: May 30, 2017

(54) POWER SEMICONDUCTOR MODULE

(71) Applicant: Hitachi Automotive Systems, Ltd., Hitachinaka-shi, Ibaraki (JP)

(72) Inventors: Shinjiro Watari, Hitachinaka (JP); Shuichi Kokubun, Hitachinaka (JP); Takeshi Yamada, Hitachinaka (JP); Tsuyoshi Harada, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/903,713

(22) PCT Filed: May 16, 2014

(86) PCT No.: PCT/JP2014/063015
§ 371 (c)(1),
(2) Date: Jan. 8, 2016

(87) PCT Pub. No.: WO2015/004990
PCT Pub. Date: Jan. 15, 2015

(65) Prior Publication Data
US 2016/0172134 A1 Jun. 16, 2016

(30) Foreign Application Priority Data

Jul. 10, 2013 (JP) ................................. 2013-144739

(51) Int. Cl.
| H01L 23/28 | (2006.01) |
| H01L 29/16 | (2006.01) |
| H01H 45/04 | (2006.01) |
| F02N 11/08 | (2006.01) |
| H05K 5/02 | (2006.01) |
| F02N 15/06 | (2006.01) |
| H05K 3/34 | (2006.01) |

(52) U.S. Cl.
CPC .......... *H01H 45/04* (2013.01); *F02N 11/087* (2013.01); *H01L 23/28* (2013.01); *H01L 29/16* (2013.01);
(Continued)

(58) Field of Classification Search
CPC .... H01H 45/04; H05K 5/0247; F02N 11/087; H01L 23/28; H01L 29/16
(Continued)

(56) References Cited

U.S. PATENT DOCUMENTS

| 5,410,450 A | 4/1995 | Iida et al. |
| 2003/0042624 A1* | 3/2003 | Shinohara ............... H01L 23/24 |
| | | 257/787 |

(Continued)

FOREIGN PATENT DOCUMENTS

| JP | 5-47989 A | 2/1993 |
| JP | 5-160339 A | 6/1993 |

(Continued)

OTHER PUBLICATIONS

International Search Report (PCT/ISA/210) issued in PCT Application No. PCT/JP2014/063015 dated Sep. 2, 2014 with English translation (Four (4) pages).

(Continued)

*Primary Examiner* — Dao H Nguyen
(74) *Attorney, Agent, or Firm* — Crowell & Moring LLP (57) ABSTRACT

Provided is a power semiconductor module wherein stress generated at a soldering section of a relay terminal is relaxed. A power semiconductor module (1) is provided with a substrate (2), relay terminals (9, 10), external connecting terminals (13, 14) and a relay terminal holding member (6). The relay terminals (9, 10) are connected to the substrate (2) with a solder (4) therebetween. The external connecting terminals (13, 14) are bonded to the relay terminals (9, 10), respectively. The non-conductive relay terminal holding member (6) holds end portions of the relay terminals (9, 10) said end portions being on the side bonded to the solder (4).

5 Claims, 10 Drawing Sheets

(52) U.S. Cl.
CPC .......... *H05K 5/0247* (2013.01); *F02N 15/067* (2013.01); *F02N 2011/0874* (2013.01); *H01L 2924/0002* (2013.01); *H05K 3/34* (2013.01); *H05K 2201/1031* (2013.01); *H05K 2201/10424* (2013.01); *Y02P 70/611* (2015.11)

(58) Field of Classification Search
USPC .......... 257/76, 77, 343, 347, 678, 690, 787, 257/E23.14; 361/141, 707, 820; 701/22
See application file for complete search history.

(56) References Cited

U.S. PATENT DOCUMENTS

| | | | |
|---|---|---|---|
| 2006/0244121 | A1 | 11/2006 | Shibamoto et al. |
| 2010/0052449 | A1 | 3/2010 | Hashimoto et al. |
| 2013/0306991 | A1* | 11/2013 | Terai ................... H01L 25/07 257/77 |

FOREIGN PATENT DOCUMENTS

| | | | |
|---|---|---|---|
| JP | 5-167002 | A | 7/1993 |
| JP | 11-177017 | A | 7/1999 |
| JP | 2006-310523 | A | 11/2006 |
| JP | 2010-63242 | A | 3/2010 |

OTHER PUBLICATIONS

Japanese-language Written Opinion (PCT/ISA/237) issued in PCT Application No. PCT/JP2014/063015 dated Sep. 2, 2014 (Five (5) pages).

\* cited by examiner

POWER SEMICONDUCTOR MODULE

TECHNICAL FIELD

The present invention relates to a power semiconductor module, and particularly to a power semiconductor power module provided with a relay terminal for connection between a substrate and an external connecting terminal.

BACKGROUND ART

Conventionally, wire bonding has been frequently used for connection between a substrate and an external connecting terminal in power semiconductor modules.

In recent years, there is a request for an apparatus in which a drive device and a control device are integrated, that is, a mechanically and electrically integrated apparatus in order to obtain an increase in capacity, size reduction, power loss reduction, noise reduction, and further reduction of the number of parts. In the mechanically and electrically integrated apparatus, a relay terminal is used instead of wire bonding.

However, current flowing in the relay terminal increases along with the increase in capacity, and a heat generation amount increases on the other hand. Thus, a difference in thermal expansion between the substrate and the relay terminal is caused and stress on a soldering section is generated, and there is a concern of reduction in service life of a solder.

There is a known technique that mitigates stress to be applied to a soldering section by using a copper material subjected to annealing in advance as a relay terminal, and employing a bend structure in a lower part in order to improve service life of a solder between the relay terminal and the soldering section (for example, see PTL 1).

In addition, there is a known technique that reduces damage according to repetition of a temperature cycle of a soldering section and improves durability by soldering a first layer, made of a first material having a thermal expansion coefficient approximating to that of a substrate, to the substrate in order to improve service life of the solder between a relay terminal and the soldering section (for example, see PTL 2).

CITATION LIST

Patent Literatures

PTL 1: Japanese Patent Application Laid-Open No 2010-63242

PTL 2: Japanese Patent Application Laid-Open No H05-47989

SUMMARY OF INVENTION

Technical Problem

There is an effect of mitigating the stress to be applied to the soldering section which is caused due to the difference in thermal expansion between the substrate and the relay terminal in the structure as described in PTL 1, in which the copper material subjected to the annealing in advance is used for the relay terminal, and the bend structure is employed in the lower part, and further in the structure as described in PTL 2, in which the first layer, made of the first material having the thermal expansion coefficient approximating to that of the structure, is soldered to the substrate.

However, it difficult to mitigate an initial stress at time of connecting the relay terminal and an external connecting terminal as will be described hereinafter.

The relay terminal is solder-joined to the substrate together with an electronic component to be mounted to the substrate using a solder reflow furnace. These relay terminal and electronic component are mounted on a solder which is printed on a conductor pattern of the substrate.

It is well-known that a melt timing of the solder is different due to a variation in furnace temperature or a difference in heat capacity of mounting parts at the time of solder reflow, and tension of the solder previously melt acts on the electronic component so that the electronic component is solder-joined in the state of being deviated from a predetermined position. Such a phenomenon is the same in the relay terminal, and the relay terminal is solder-joined in the state of being deviated from a predetermined position due to the above reason.

It is necessary to forcibly match a position of a tip end of the relay terminal positionally deviated with a position of a tin end of the external connecting terminal in order to connect the external connecting terminal and the relay terminal in the state of being deviated from the predetermined position. To be specific, positioning is performed by bending the relay terminal tip end, on a side of a joined surface with the external connecting terminal which is not solder-joined, in a direction of the external connecting terminal. At this time, a tending force of the relay terminal tip end is transmitted to the soldering section of the relay terminal and stress is generated to the soldering section.

This stress is steadily applied to the soldering section the initial stress, and is superimposed with the stress in the soldering section caused by the difference in thermal expansion, thereby introducing the reduction in service life of the solder. In addition, in a case in which the positional deviation of the relay terminal is large, joining with the external connecting terminal is not sufficiently performed, and a required weld strength or melting cross-sectional area is not obtained even if the connection is successfully performed, thereby forming a product with a defect or low reliability.

An object of the present invention is to provide a power semiconductor module capable of mitigating stress to be generated in a soldering section of a relay terminal.

Solution to Problem

To achieve the above object, the present invention includes: a substrate; a relay terminal to be connected to the substrate via a solder; an external connecting terminal to be joined to the relay terminal; and a non-conductive relay terminal holding member to hold an end portion of the relay terminal on a side of a joined surface with the solder.

Advantageous Effects of Invention

According to the present invention, it is possible to mitigate stress to be generated in a soldering section of a relay terminal. Other problems, configurations and effects than the above description will be apparent from the following descriptions of embodiments.

DESCRIPTION OF EMBODIMENTS

Hereinafter, description will be given regarding a configuration of a power semiconductor module according to a first to fourth embodiments of the present invention with reference to FIGS. 1A to 12. The power semiconductor module controls drive of a load (a motor, a solenoid or the like) to be used in a vehicle, for example. Incidentally, the same parts are attached with the same reference numerals in the drawings.

First Embodiment

Hereinafter, a description will be given regarding the overall configuration of the power semiconductor module according to the first embodiment with reference to FIGS. 1A to 3.

Figure 1A:
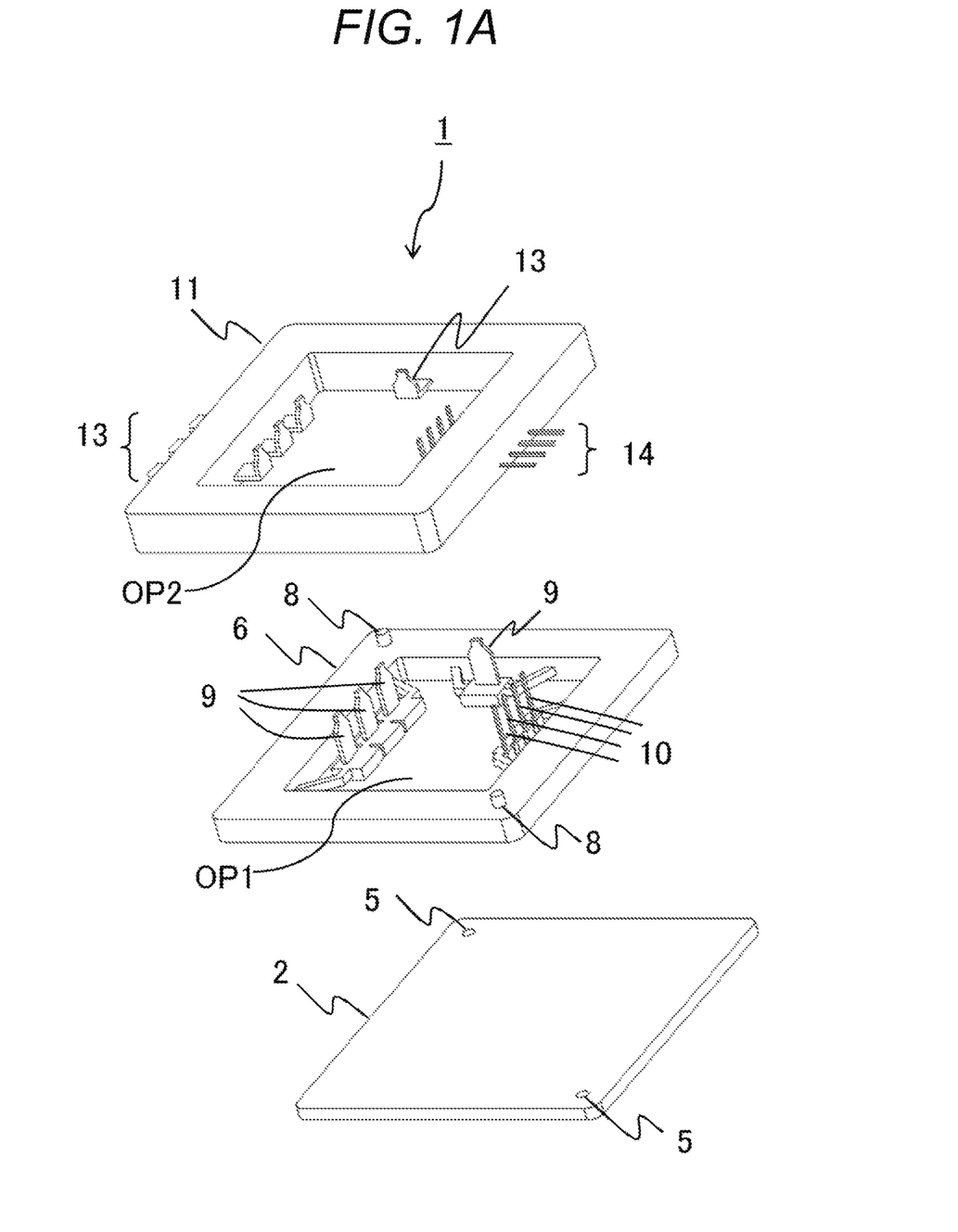
FIG. 1A is an exploded perspective view of a power semiconductor module according to a first embodiment of the present invention.

First, a configuration of a power semiconductor module 1 will be described with reference to FIG. 1A. FIG. 1A is an exploded perspective view of the power semiconductor module 1 according to the first embodiment of the present invention.

The power semiconductor module 1 of the first embodiment is configured of a substrate 2, a relay terminal holding member 6, and an external connecting terminal holding member 11 which are stacked.

The substrate 2 having a quadrangular shape is provided with a through hole 5 to be engaged with a convex section 7 (FIG. 1B) of the relay terminal holding member 6 at least at one or more locations. FIG. 1A illustrates the through hole 5 at two locations, for example.

The relay terminal holding member 6 having an angular frame shape is formed using an insulating member made of synthetic resin or the like. The relay terminal holding member 6 is provided with an opening section OP1 at an inner side thereof. Relay terminals 9 and 10 are embedded to be fitted with the relay terminal holding member 6. The relay terminals 9 and 10 are disposed so as to be defined in optimal positions at the time of being joined to external connection terminals 13 and 14. The relay terminal holding member 6 is provided with a convex section 8 to be engaged with a concave section 12 of the external connecting terminal holding member 11 at least at one or more locations. FIG. 1A illustrates the convex section 8 at two locations, for example.

Incidentally, a relay terminal 9 is a terminal of a power system, and a relay terminal 10 is a terminal of a signal system. Specific examples of the relay terminals 9 and 10 will be described later with reference to FIG. 10.

The external connecting terminal holding member 11 having an angular frame shape is formed using an insulating member made of synthetic resin or the like. The external connecting terminal holding member 11 is provided with an open section OP2 at an inner side thereof. The external connection terminals 13 and 14 are embedded to be fitted with the external connecting terminal holding member 11. The external connection terminals 13 and 14 are disposed to be defined in optimal positions at the time of joining of the relay terminals 9 and 10.

Incidentally, the external connecting terminal 13 is a terminal of the power system, and the external connecting terminal 14 is a terminal of the signal system. The external connection terminals 13 and 14 are connected to the substrate 2 via the relay terminals 9 and 10 when being joined to the relay terminals 9 and 10, respectively.

Figure 1B:
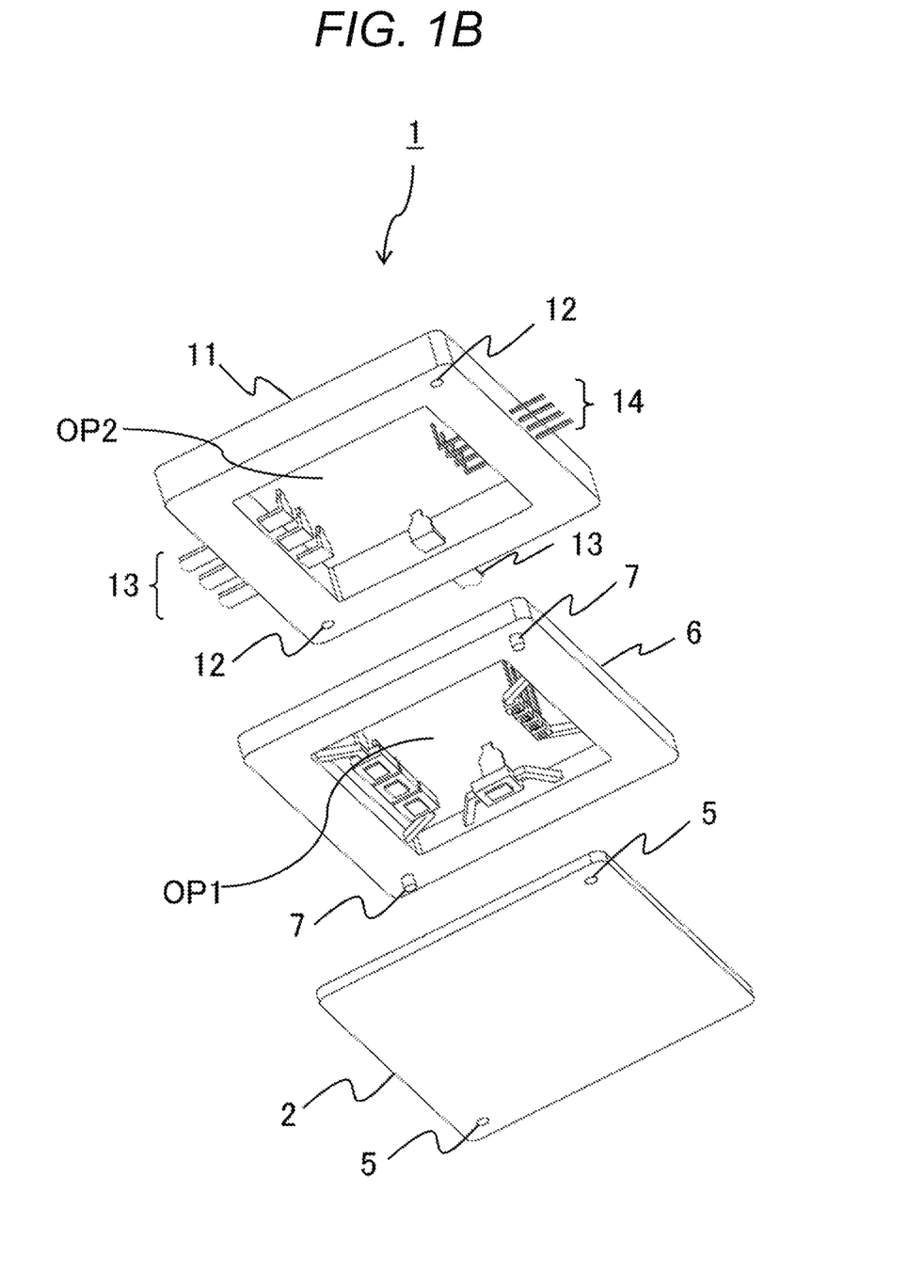
FIG. 1B is an exploded perspective view of the power semiconductor module illustrated in FIG. 1A which is seen from a different direction.

Next, the configuration of the power semiconductor module 1 will be described with reference to FIG. 1B. FIG. 1B is an exploded perspective view of the power semiconductor module 1 illustrated in FIG. 1A from a different direction.

The external connecting terminal holding member 11 is provided with the concave section 12 to be engaged with the convex section 8 (FIG. 1A) of the relay terminal holding member 6 at least at one or more locations. FIG. 1B illustrates the concave section 12 at two locations, for example.

The relay terminal holding member 6 is provided with the convex section 7 to be engaged with a concave section 5 of the substrate 2 at least at one or more locations. FIG. 1B illustrates the convex section 7 at two locations, for example.

Figure 2:
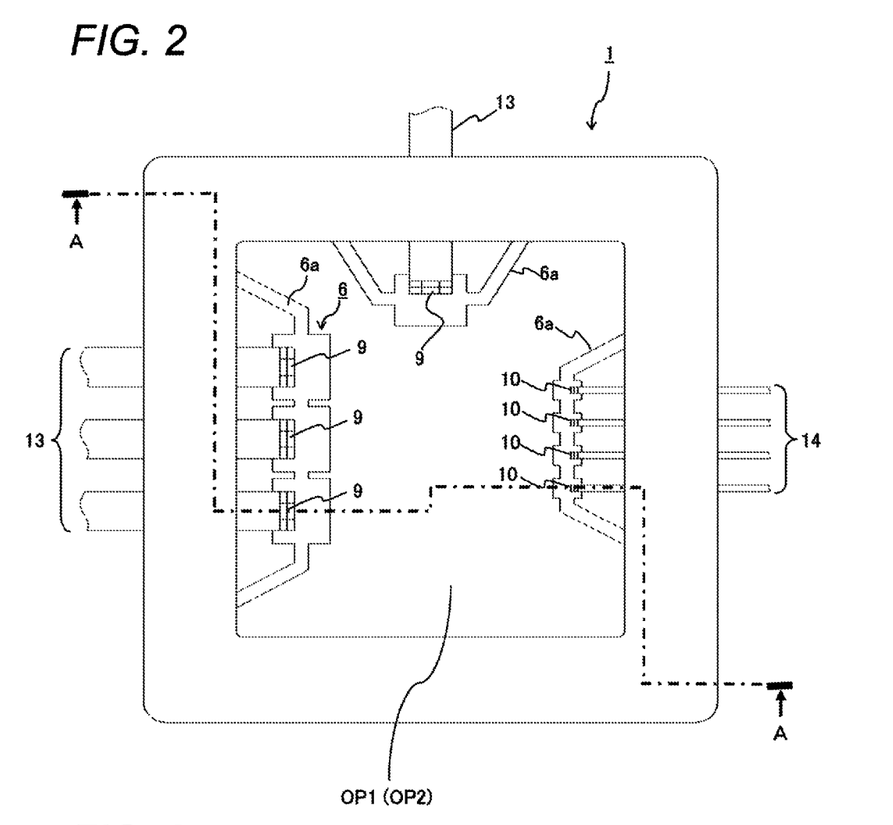
FIG. 2 is a plan view of the power semiconductor module according to the first embodiment of the present invention.

Next, the configuration of the power semiconductor module 1 will be described with reference to FIG. 2. FIG. 2 is a plan view of the power semiconductor module 1 according to the first embodiment of the present invention.

As illustrated in FIG. 2, the external connection terminals 13 and 14 and the relay terminals 9 and 10 are positioned such that end portions of the external connection terminals 13 and 14 held by the external connecting terminal holding member 11 and end portions of the relay terminals 9 and 10 held by the relay terminal holding member 6 are in contact with each other at least at the time of joining.

Incidentally, each of the external connection terminals 13 and 14 and the relay terminals 9 and 10 is welded. This welding includes, for example, an arc welding, a resistance welding and the like, but is not limited thereto. The relay terminal holding member 6 holds the relay terminals 9 and 10 at arm sections 6a each of which has a substantially U shape and protrudes to the opening section OP1 side.

Figure 3:
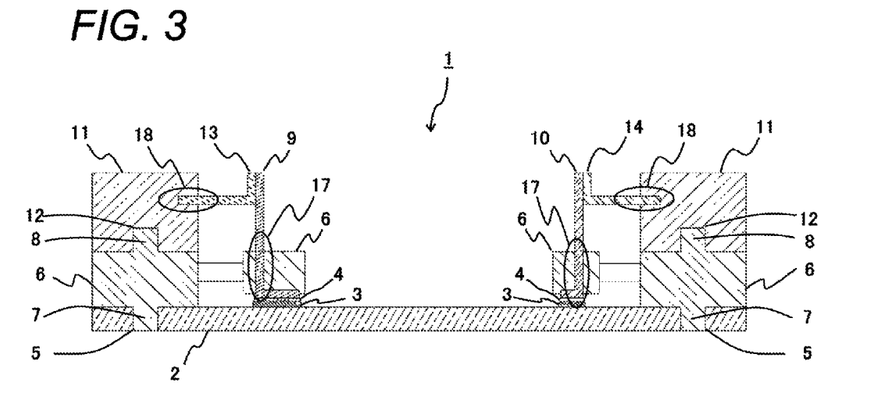
FIG. 3 is a cross-sectional view illustrating an A-A cross-section of FIG. 2

Next, the configuration of the power semiconductor module 1 will be described with reference to FIG. 3. FIG. 3 is a cross-sectional view illustrating an A-A cross-section of FIG. 2.

A wiring pattern 3, made of a conductor, is formed in the substrate 2 on a metal base with an insulating layer interposed therebetween, and a solder 4 is formed thereon. The relay terminals 9 and 10 are connected to the substrate 2 via the wiring pattern 3 and the solder 4.

The through hole 5 provided in the substrate 2 and the convex section 7 provided in the relay terminal holding member 6 are engaged with each other, and the relay terminals 9 and 10 are fitted with fitting sections 17 provided in the relay terminal holding member 6. Accordingly, the relay terminals 9 and 10 are disposed in predetermined positions without causing any positional deviation when being mounted to the substrate 2 by solder reflow.

In addition, the relay terminals 9 and 10 are fitted with the fitting sections 17 of the relay terminal holding member 6 so as to be defined in optimal positions at the time of being joined to the external connection terminals 13 and 14. That is, the fitting section 17 positions the relay terminals 9 and 10 such that the relay terminals 9 and 10 and the external connection terminals 13 and 14 are in contact with each other at least at the time of joining.

In addition, the convex section 8 provided in the relay terminal holding member 6 and the concave section 12 provided in the external connecting terminal holding member 11 are engaged with each other, and the external connection terminals 13 and 14 are fitted with fitting sections 18 of the external connecting terminal holding member 11 so as to be defined in the optimal positions at the time of being joined to the relay terminals 9 and 10.

In this manner, the relay terminals 9 and 10 and the external connection terminal is 13 and 14 can secure required weld strength and melting cross-sectional area.

Here, the non-conductive relay terminal holding member 6 holds the end portions of the relay terminals 9 and 10 on the joined surface side with the solder 4. In addition, the external connecting terminal holding member 11, the relay terminal holding member 6, and the substrate 2 are stacked as illustrated in FIG. 3.

As described above, a relative positional accuracy between the relay terminals 9 and 10 and the external connection terminals 13 and 14 increases according to this embodiment. That is, the relay terminals 9 and 10 do not cause the positional deviation at the time of solder reflow. Thus, there is no need of forcibly bending and positioning the relay terminals 9 and 10 at the time of joining the relay terminals 9 and 10 and the external connection terminals 13 and 14, respectively. Further, it is possible to mitigate stress on a soldering section, and to improve service life of the solder. In addition, it is possible to obtain the same effect even when the solder reflow is implemented after stacking the external connecting terminal holding member 11, the relay terminal holding member 6, and the substrate 2.

Figure 4:
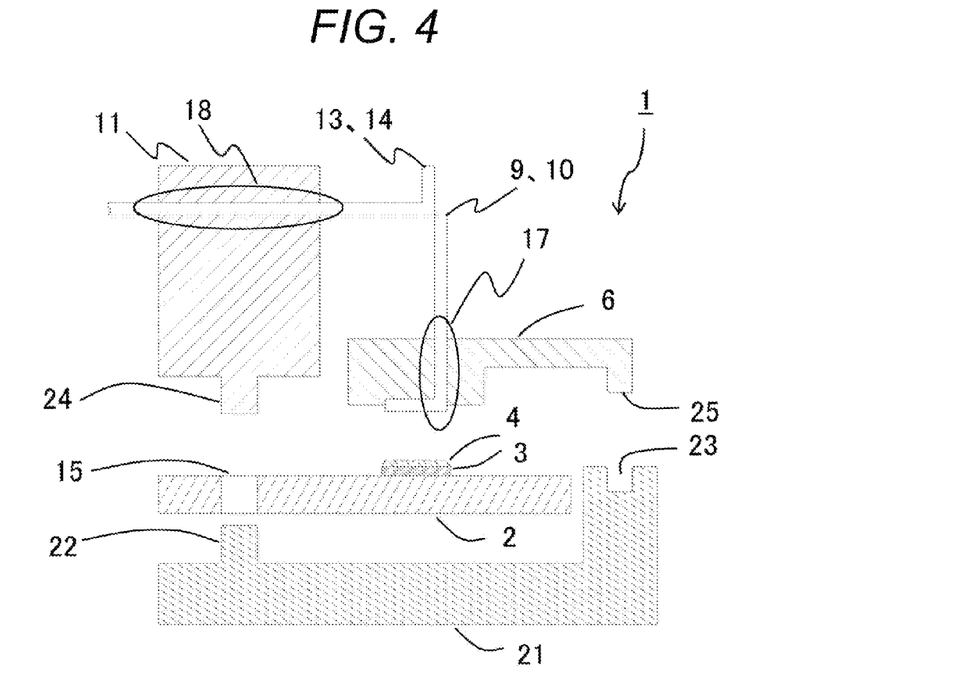
FIG. 4 is an exploded view of the power semiconductor module according to a second embodiment of the present invention.

Next, a description will be given regarding the power semiconductor module according to the second embodiment of the present invention with reference to FIGS. 4 and 5.

First, a description will be given regarding configuration of the power semiconductor module 1 according to the second embodiment of the present invention with reference to FIG. 4. FIG. 4 is an exploded view of the power semiconductor module 1 according to the second embodiment of the present invention.

A jig 21 is a jig to be used at the time of solder reflow, and is a jig to be used at the time of solder-joint of the relay terminals 9 and 10 to the substrate 2. The jig 21 is provided with a convex section 22 to be engaged with a through hole 15 of the substrate 2 at least at one or more locations. Further, the jig 21 is provided with a concave section 23 to be engaged with a convex section 25 of the relay terminal holding member 6 at least at one or more locations. FIG. 4 illustrates the convex section 22 at one location and the concave section 23 at one location, for example.

The wiring pattern 3, made of a conductor, is formed in the substrate 2 on a metal base with an insulating layer interposed therebetween, and the solder 4 is formed thereon. The substrate 2 is provided with the through hole 15 to be engaged with a convex section 24 of the external connecting terminal holding member 11 at least at one or more locations. FIG. 4 illustrates the through hole 15 at one location, for example.

Further, the through hole 15 of the substrate 2 to be engaged with the convex section 24 of the external connecting terminal holding member 11 serves a role of being engaged with the convex section 22 of the jig 21 at the time of solder reflow.

The relay terminal holding member 6 is formed using an insulating member made of synthetic resin or the like, and is provided with the convex section 25 to be engaged with the concave section 23 of the jig 21 at least at one or more locations. FIG. 4 illustrates the convex section 25 at one location, for example.

In addition, the relay terminals 9 and 10 are embedded to be fitted with the fitting sections 17 of the relay terminal holding member 6 so as to be defined in optimal positions at the time of being joined to the external connection terminals 13 and 14.

Incidentally, the relay terminal 9 is a terminal of a power system, and the relay terminal 10 is a terminal of the signal system, and the both are joined to the wiring pattern 3 via the solder 4.

On the other hand, the external connecting terminal holding member 11 is formed using an insulating member made of synthetic resin or the like, and is provided with the convex section 24 to be engaged with the through hole 15 of the substrate 2 at least at one or more locations. FIG. 4 illustrates the convex section 24 at one location, for example. In addition, the external connection terminals 13 and 14 are embedded to be fitted with the fitting sections 18 of the external connecting terminal holding member 11 so as to be defined in optimal positions at the time of being joined to the relay terminals 9 and 10.

Incidentally, the external connecting terminal 13 is a terminal of the power system, and the external connecting terminal 14 is a terminal of the signal system. The both are connected to the substrate 2 via the relay terminals 9 and 10 when being joined to the relay terminals 9 and 10, respectively.

The through hole 15 provided in the substrate 2 and the convex section 22, which is provided in the jig 21 to be used at the time of solder reflow, are engaged with each other, and the concave section 23 provided in the jig 21 and the convex section 25 provided in the relay terminal holding member 6 are engaged with each other. Further, the relay terminals 9 and 10 are fitted with the fitting sections 17 of the relay terminal holding member 6.

Accordingly, the relay terminals 9 and 10 are disposed in predetermined positions without causing any positional deviation when being mounted to the substrate 2 by solder reflow. In addition, the relay terminals 9 and 10 are fitted with the fitting sections 17 of the relay terminal holding member 6 so as to be defined in the optimal positions at the time of being joined to the external connection terminals 13 and 14.

In addition, the through hole 15 provided in the substrate 2 and the convex section 24 provided in the external connecting terminal holding member 11 are engaged with each other, and the external connection terminals 13 and 14 are fitted with the fitting sections 18 of the external connecting terminal holding member 11 to be defined in the optimal positions at the time of being joined to the relay terminals 9 and 10.

Next, a description will be given regarding a finished product of the power semiconductor module 1 according to the second embodiment of the present invention with reference to FIG. 5. FIG. 5 is a cross-sectional view of the power semiconductor module according to the second embodiment of the present invention.

As described with reference to FIG. 4, the through hole 15 of the substrate 2 is engaged with the convex section 22 of the jig 21 at the time of solder reflow. Accordingly, the substrate 2 is fixed to the jig 21. Meanwhile, the convex section 22 of the jig 21 is withdrawn from the through hole 15 of the substrate 2 after the soldering, and the through hole 15 of the substrate 2 and the convex section 24 of the external connecting terminal holding member 11 are engaged with each other as illustrated in FIG. 5. Accordingly, the external connecting terminal holding member 11 is fixed to the substrate 2.

Figure 5:
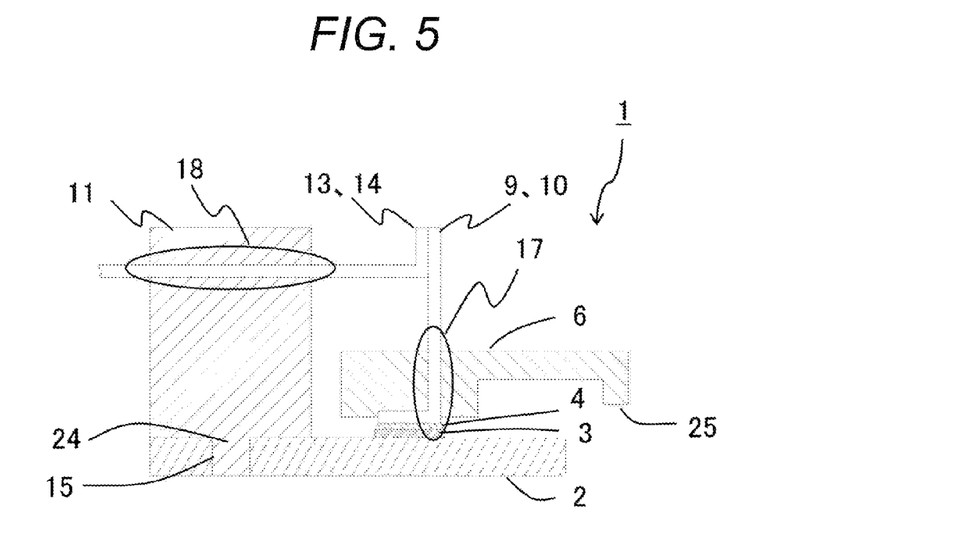
FIG. 5 is a cross-sectional view of the power semiconductor module according to the second embodiment of the present invention.

Here, as illustrated in FIG. 5, the substrate 2, and the relay terminal holding member 6 are stacked, and the substrate 2, and the external connecting terminal holding member 11 are stacked. In other words, the relay terminal holding member 6 and the external connecting terminal holding member 11 are disposed on the substrate 2.

As described above, the relative positional accuracy between the relay terminals 9 and 10 and the external connection terminals 13 and 14 increases according to this embodiment. That is, the relay terminals 9 and 10 do not cause the positional deviation at the time of solder reflow. Thus, there is no need of forcibly bending and positioning the relay terminals 9 and 10 at the time of joining the relay terminals 9 and 10 and the external connection terminals 13 and 14, respectively. Further, it is possible to mitigate the stress on the soldering section, and to improve the service life of the solder. In addition, it is possible to obtain the same effect even when the solder reflow implemented after stacking the jig 21, the substrate 2, and the relay terminal holding member 6 and stacking the jig 21, the substrate 2, and the external connecting terminal holding member 11.

Figure 6:
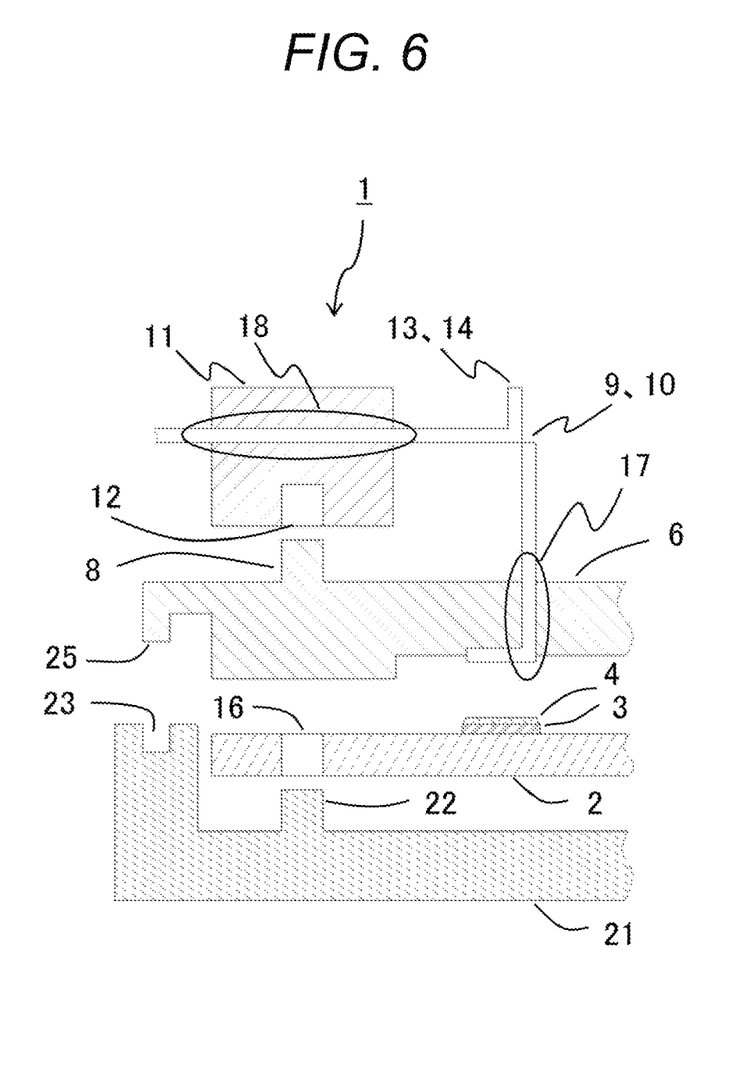
FIG. 6 is an exploded view of a power semiconductor module according to a third embodiment of the present invention.

Next, a description will be given regarding the power semiconductor module 1 according to the third embodiment of the present invention with reference to FIGS. 6 and 7.

First, a description will be given regarding a configuration of the power semiconductor module 1 according to the third embodiment of the present invention and a configuration of a jig to be used therein with reference to FIG. 6. FIG. 6 is an exploded view of the power semiconductor module 1 according to the third embodiment of the present invention.

The jig 21 is a jig to be used at the time of solder reflow, and is a jig to be used at the time of solder-joint of the relay terminals 9 and 10 to the substrate 2. The jig 21 is provided with the convex section 22 to be engaged with a through hole 16 of the substrate 2 at least at one or more locations. Further, the jig 21 is provided with the concave section 23 to be engaged with the convex section 25 of the relay terminal holding member 6 at least at one or more locations. FIG. 6 illustrates the convex section 22 at one location and the concave section 23 at one location, for example.

The wiring pattern 3, made of a conductor, is formed in the substrate 2 on a metal base with an insulating layer interposed therebetween, and the solder 4 is formed thereon. The substrate 2 is provided with the through hole 16 to be engaged with the convex section 22 of the jig 21 at the time of solder reflow at least at one or more locations. FIG. 6 illustrates the through hole 16 at one location, for example.

The relay terminal holding member 6 is formed using an insulating member made of synthetic resin or the like, and is provided with the convex section 25 to be engaged with the concave section 23 of the jig 21 at least at one or more locations. FIG. 6 illustrates the convex section 25 at one location, for example.

In addition, the relay terminals 9 and 10 are embedded to be fitted with the fitting sections 17 of the relay terminal holding member 6 so as to be defined in optimal positions at the time of being joined to the external connection terminals 13 and 14. Further, the relay terminal holding member 6 is provided with the convex section 8 to be engaged with the concave section 12 of the external connecting terminal holding member 11 at least at one or more locations. FIG. 6 illustrates the convex section 8 at one location, for example.

Incidentally, the relay terminal 9 is a terminal of a power system, and the relay terminal 10 is a terminal of a signal system, and the both are joined to the wiring pattern 3 via the solder 4.

On the other hand, the external connecting terminal holding member 11 is formed using an insulating member made of synthetic resin or the like, and is provided with the concave section 12 to be engaged with the convex section 8 of the relay terminal holding member 6 at least at one or more locations. FIG. 6 illustrates the concave section 12 at one location, for example.

In addition, the external connection terminals 13 and 14, are embedded to be fitted with the fitting sections 18 of the external connecting terminal holding member 11 so as to be defined in optimal positions at the time of being joined to the relay terminals 9 and 10.

Incidentally, the external connecting terminal 13 is a terminal of the power system, and the external connecting terminal 14 is a terminal of the signal system. The both are connected to the substrate 2 via the relay terminals 9 and 10 when being joined to the relay terminals 9 and 10, respectively.

The through hole 16 provided in the substrate 2 and the convex section 22, which is provided in the jig 21 to be used at the time of solder reflow, are engaged with each other, and the concave section 23 provided in the jig 21 and the convex section 25 provided in the relay terminal holding member 6 are engaged with each other. Further, the relay terminals 9 and 10 are fitted with the fitting sections 17 of the relay terminal holding member 6. Accordingly, the relay terminals 9 and 10 are disposed in predetermined positions without causing any positional deviation when being mounted to the substrate 2 by solder reflow. In addition, the relay terminals 9 and 10 are fitted with the fitting sections 17 of the relay terminal holding member 6 so as to be defined in the optimal positions at the time of being joined to the external connection terminals 13 and 14.

In addition, the convex section 8 provided in the relay terminal holding member 6 and the concave section 12 provided in the external connecting terminal holding member 11 are engaged with each other, and the external connection terminal s 13 and 14 are fitted with the fitting sections 18 of the external connecting terminal holding member 11 so as to be defined in optimal positions at the time of being joined to the relay terminals 9 and 10.

Next, a description will be given regarding a finished product of the power semiconductor module 1 according to the third embodiment of the present invention with reference to FIG. 7. FIG. 7 is a cross-sectional view of the power semiconductor module 1 according to the third embodiment of the present invention.

As described with reference to FIG. 6, the through hole 16 of the substrate 2 is engaged with the convex section 22 of the jig 21 at the time of solder reflow. Accordingly, the substrate 2 is fixed to the jig 21. Meanwhile, the convex section 22 of the jig 21 is withdrawn from the through hole 16 of the substrate 2 after the soldering as illustrated in FIG. 7. Incidentally, the relay terminal holding member 6 and the substrate 2 are fixed by an adhesive.

Figure 7:
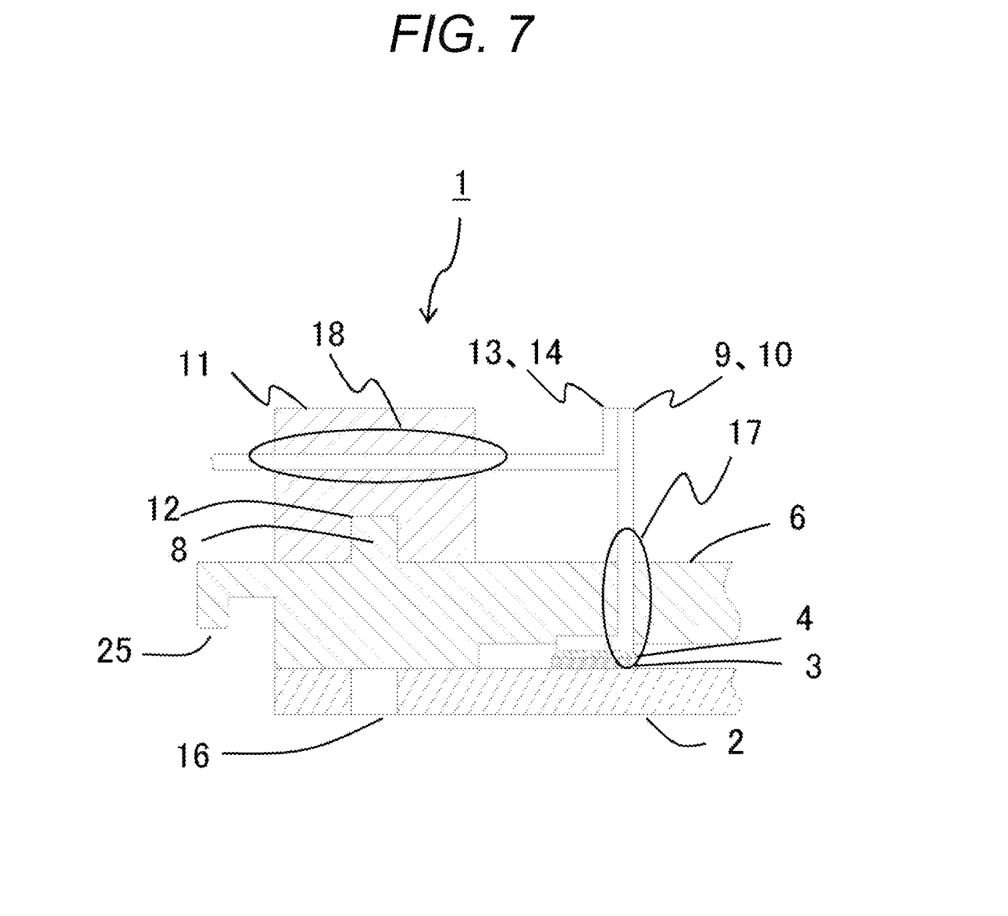
FIG. 7 is a cross-sectional view of the power semiconductor module according to the third embodiment of the present invention.

Here, as illustrated in FIG. 7, the external connecting terminal holding member 11, the relay terminal holding member 6, and the substrate 2 are stacked.

As described above, the relative positional accuracy between the relay terminals 9 and 10 and the external connection terminals 13 and 14 is improved according to this embodiment. That is, the relay terminal 9 and 10 do not cause the positional deviation at the time of solder reflow. Thus, there is no need of forcibly bending and positioning the relay terminals 9 and 10 at the time of joining the relay terminals 9 and 10 and the external connection terminals 13 and 14, respectively. Further, it is possible to mitigate the stress on the soldering section, and to improve the service life of the solder. In addition, it is possible to obtain the same effect even when the solder reflow is implemented after stacking the external connecting terminal holding member 11, the relay terminal holding member 6, the substrate 2, and the jig 21.

Figure 8:
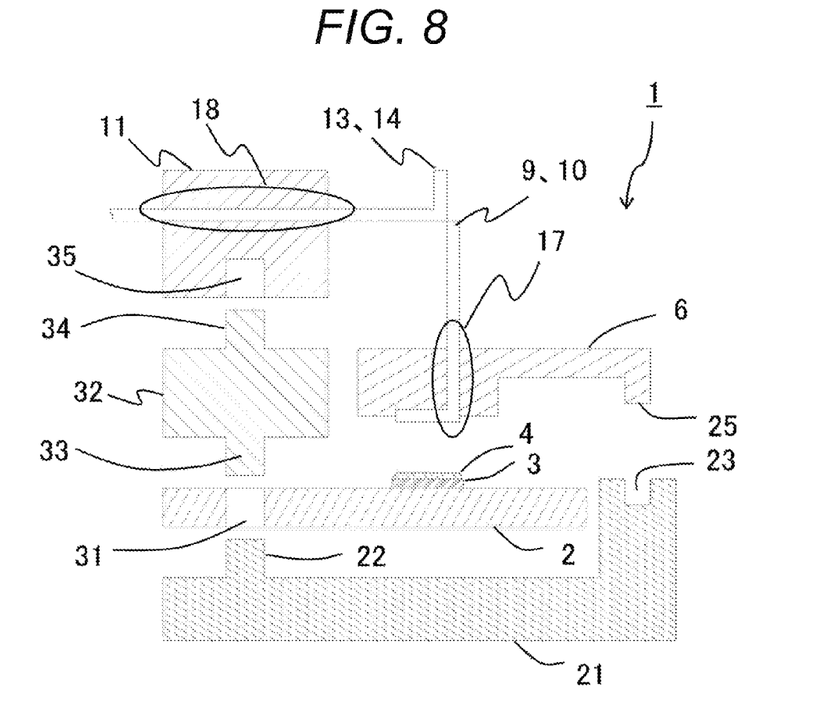
FIG. 8 is an exploded view of a power semiconductor module according to a fourth embodiment of the present invention.

Next, a description will be given regarding the power semiconductor module according to the fourth embodiment of the present invention with reference to FIGS. 8 and 9.

First, a description will be given regarding a configuration of the power semiconductor module 1 according to the fourth embodiment of the present invention and a configuration of a jig to be used therein with reference to 8. FIG. 8 is an exploded view of the power semiconductor module 1 according to the fourth embodiment of the present invention.

The jig 21 is a jig to be used at the time of solder reflow, and is a jig to be used at the time of solder-joint of the relay terminals 9 and 10 to the substrate 2. The jig 21 is provided with the convex section 22 to be engaged with a through hole 31 of the substrate 2 at least at one or more locations. Further, the jig 21 is provided with the concave section 23 to be engaged with the convex section 25 of the relay terminal holding member 6 at least at one or more locations. FIG. 8 illustrates the convex section 22 at one location, and due concave section 23 at one location, for example.

The wiring pattern 3, made of a conductor, is formed in the substrate 2 on a metal base with an insulating layer interposed therebetween, and the solder 4 is formed thereon. The substrate 2 is provided with the through hole 31 to be engaged with a convex section 33 of an intermediate member 32 at least at one or more locations. FIG. 8 illustrates the through hole 31 at one location, for example.

Further, the through hole 31 of the substrate 2 to be engaged with the convex section 33 of the intermediate member 32 serves a role of being engaged with the convex section 22 of the jig 21 at the time of solder reflow.

The relay terminal holding member 6 is formed using an insulating member made of synthetic resin or the like, and is provided with the convex section 25 to be engaged with the concave section 23 of the jig 21 at least at one or more locations. FIG. 3 illustrates the convex section 25 at one location, for example.

In addition, the relay terminals 9 and 10 are embedded to be fitted with the fitting sections 17 of the relay terminal holding member 6 so as to be defined in optimal positions at the time of being joined to the external connection terminals 13 and 14.

Incidentally, the relay terminal 9 is a terminal of a power system, and the relay terminal 10 is a terminal of a signal system. The both are joined to the wiring pattern 3 via the solder 4.

The intermediate member 32 is formed using an insulating member made of synthetic resin or the like, or using a conductive member such as a magnetic body, and is provided with the convex section 33 to be engaged with the through hole 31 of the substrate 2 at least at one or more locations. In addition, the intermediate member 32 is provided with a convex section 34 to be engaged with a concave section 35 of the external connecting terminal holding member 11 at least at one or more locations. FIG. 8 illustrates the convex section 33 at one location, and the convex section 34 at one location, for example.

On the other hand, the external connecting terminal holding member 11 is formed using an insulating member made of synthetic resin or the like, and is provided with the concave section 35 to be engaged with the convex section 34 of the intermediate member 32 at least at one or more locations. FIG. 8 illustrates the concave section 35 at one location, for example. In addition, the external connection terminals 13 and 14 are embedded to be fitted with the fitting sections 18 of the external connecting terminal holding member 11 so as to be defined in optimal positions at the time of being joined to the relay terminals 9 and 10.

Incidentally, the external connecting terminal 13 is a terminal of the power system, and the external connecting terminal 14 is a terminal of the signal system. The both are connected to the substrate 2 via the relay terminals 9 and 10 when being joined to the relay terminals 9 and 10.

The through hole 31 provided in the substrate 2 and the convex section 22, which is provided in the is 21 to be used at the time of solder reflow, are engaged with each other, and the concave section 23 provided in the jig 21 and the convex section 25 provided in the relay terminal holding member 6 are engaged with each other. Further, the relay terminals 9 and 10 are fitted with the fitting sections 17 of the relay terminal holding member 6. Accordingly, the relay terminals 9 and 10 are disposed in predetermined positions without causing any positional deviation when being mounted to the substrate 2 by solder reflow. In addition, the relay terminals 9 and 10 are fitted with the fitting sections 17 of the relay terminal holding member 6 so as to be defined in the optimal positions at the time of being joined to the external connection terminals 13 and 14.

In addition, the convex section 33 provided in the intermediate member 32 and the through hole 31 provided in the substrate 2 are engaged with each other, and the convex section 34 provided in the intermediate member 32 and the concave section 35 provided in the external connecting terminal holding member 11 are engaged with each other. Further, the external connection terminals 13 and 14 are fitted with the fitting sections 18 of the external connecting terminal holding member 11 so as to be defined in the optimal positions at the time of being joined to the relay terminals 9 and 10.

Next, a description will be given regarding a finished product of the power semiconductor module 1 according to the fourth embodiment of the present invention with reference to FIG. 9. FIG. 9 is a cross-sectional view of the power semiconductor module 1 according to the fourth embodiment of the present invention.

As described with reference to FIG. 8, the through hole 31 of the substrate 2 is engaged with the convex section 22 of the jig 21 at the time of solder reflow. Accordingly, the substrate 2 is fixed to the jig 21. Meanwhile, the convex section 22 of the jig 21 is withdrawn from the through hole 31 of the substrate 2 after the soldering, and the through hole 31 of the substrate 2 and the convex section 33 of the intermediate member 32 are engaged with each other as illustrated in FIG. 9. Accordingly, the intermediate member 32 is fixed to the substrate 2.

Figure 9:
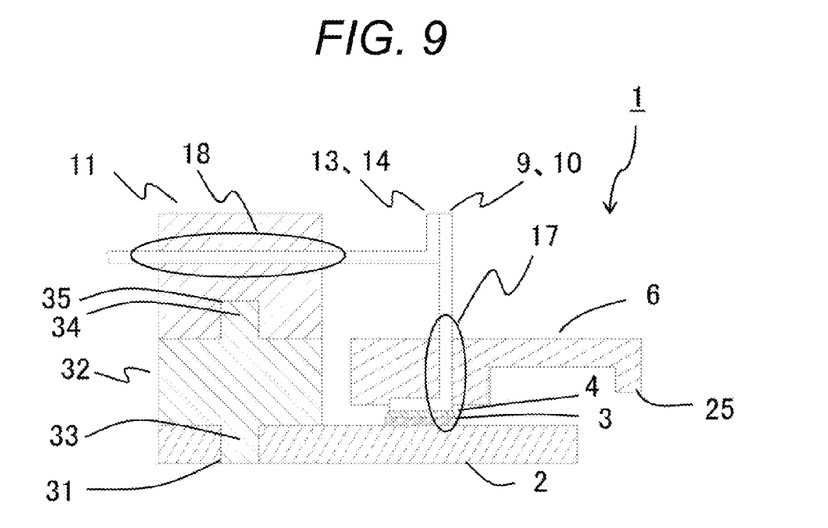
FIG. 9 is a cross-sectional view of the power semiconductor module according to the fourth embodiment of the present invention.

Here, as illustrated in FIG. 9, the substrate 2 and the relay terminal holding member 6 are stacked, and the substrate 2, the intermediate member 32, and the external connecting terminal holding member 11 are stacked.

As described above, the relative positional accuracy between the relay terminals 9 and 10 and the external connection terminals 13 and 14 is improved according to this embodiment. That is, the relay terminals 9 and 10 do not cause the positional deviation at the time of solder reflow. Thus, there is no need of forcibly bending and positioning the relay terminals 9 and 10 at the time of joining the relay terminals 9 and 10 and the external connection terminals 13 and 14, respectively. Further, it is possible to mitigate the stress on the soldering section, and to improve the service life of the solder. In addition, it is possible to obtain the same effect even when the solder reflow is implemented after stacking the jig 21, the substrate 2, and the relay terminal holding member 6 and stacking the jig 21, the substrate 2, the intermediate member 32, and the external connecting terminal holding member 11.

First Modified Example

In the first to fourth embodiments, provided are the through hole 5 of the substrate for the engagement with the relay terminal holding member;

the convex section 7 of the relay terminal holding member for the engagement with the substrate;

the convex section 8 of the relay terminal holding member for the engagement with the external connecting terminal holding member;

the concave section 12 of the external connecting terminal holding member for the engagement with the relay terminal holding member;

the through hole 15 of the substrate for the engagement with the external connecting terminal holding member;

the through hole 16 of the substrate for the engagement with the jig;

the convex section 22 of the jig for the engagement with the substrate;

the concave section 23 of the jig for the engagement with the relay terminal holding member;

the convex section 24 of the external connecting terminal holding member for the engagement with the substrate;

the convex section 25 of the relay terminal holding member for the engagement with the jig;

the through hole 31 of the substrate for the engagement with the intermediate member;

the convex section 33 of the intermediate member for the engagement with the substrate;

the convex section 34 of the intermediate member for the engagement with the external connecting terminal holding member; and the concave section 35 of the external connecting terminal holding member for the engagement with the intermediate member.

The respective through holes, convex sections, and concave sections may be freely combined with one another (not illustrated) as long as the effect of the present invention can be obtained. Incidentally, these through holes, convex sections, and concave sections function as engagement sections.

In addition, in a case in which each of the through holes, the convex sections, and the concave sections has a cylindrical shape, combination of two or more thereof is preferable. In the case of having a shape other than the cylindrical shape, combination of one or more thereof having an asymmetric shape is preferable (not illustrated).

Second Modified Example

The relay terminal 9 of the power system and the relay terminal 10 of the signal system may be configured such that a plurality of the relay terminals 9 of the power system and a plurality of the relay terminals 10 of the signal system are formed using one relay terminal holding member in the first to fourth embodiments and the first modified example. In addition, each of the relay terminal 9 of the power system as a single body and the relay terminal 10 of the signal system as a single body may be configured using a single relay terminal holding member (not illustrated).

In addition, the external connecting terminal 13 of the power system and the external connecting terminal 14 of the signal system may be configured such that a plurality of the external connecting terminals 13 of the bower system and a plurality of the external connecting terminals 14 of the signal system are formed using one external connecting terminal holding member. Further, each of the external connecting terminal 13 of the power system as a single body and the external connecting terminal 14 of the signal system as a single body may be configured using a single external connecting terminal holding member (not illustrated).

Application Example

Next, an engine starting device in which the power semiconductor module 1 according to the embodiments of the present invention will be described as an application example with reference to FIGS. 10 to 12.

First, a configuration of an engine starting device 100 will be described with reference to FIG. 10. FIG. 10 is a circuit diagram of the engine starting device as the application example of the present invention.

The engine starting device 100 causes a pinion 104 to move in the arrow direction according to an operation of a magnet switch 102, and to be meshed with a ring gear 105 which is coupled with an engine. Then, a crankshaft of the engine is rotated by operating a starter motor 103 to control fuel and ignition, thereby starting the engine.

An engine control unit 107 is connected, via an ignition switch 109, to a battery 109 to be mounted to a vehicle. The magnet switch 102 and the starter motor 103 are controlled by a starter control unit 106. The magnet switch 102 and the starter motor 103 are connected to semiconductor switches 131 and 132, freewheel diodes 133 and 134, and the like via relay terminals 121, 122, 123 and 124 from external connecting terminals 111, 112, 113 and 114.

The semiconductor switches 131 and 132 are connected to the starter control unit 106. The starter control unit 106 drives the semiconductor switches 131 and 132 based on a signal from the engine control unit 107. The starter control unit 106 is connected to the engine control unit 107 and the ignition switch 109 via external connection terminals 115, 116, 117 and 118 from relay terminals 125, 126, 127 and 128.

The power semiconductor module of the embodiment is applied to a part represented by reference numeral 101. Here, the relay terminals 121, 122, 123 and 124 correspond to the relay terminal 9 of the power system, and the relay terminals 125, 126, 127 and 128 correspond to the relay terminal 10 of the signal system.

In addition, the external connecting terminals 111, 112, 113 and 114 correspond to the external connecting terminal 13 of the power system, and the relay terminals 115, 116, 117 and 113 correspond to the external connecting terminal 14 of the signal system.

Figure 10:
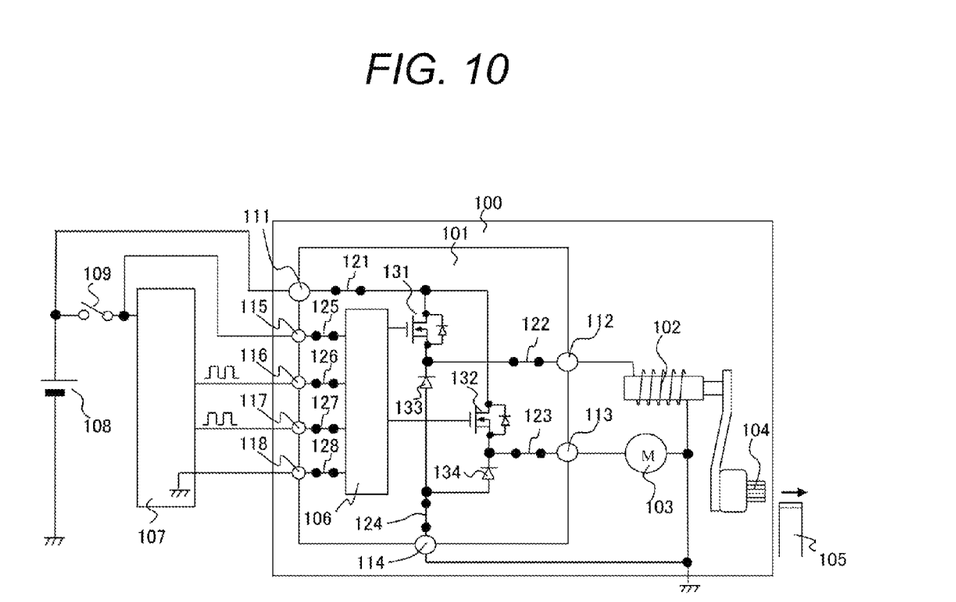
FIG. 10 is a circuit diagram of an engine starting device as an application example of the present invention.
Figure 11:
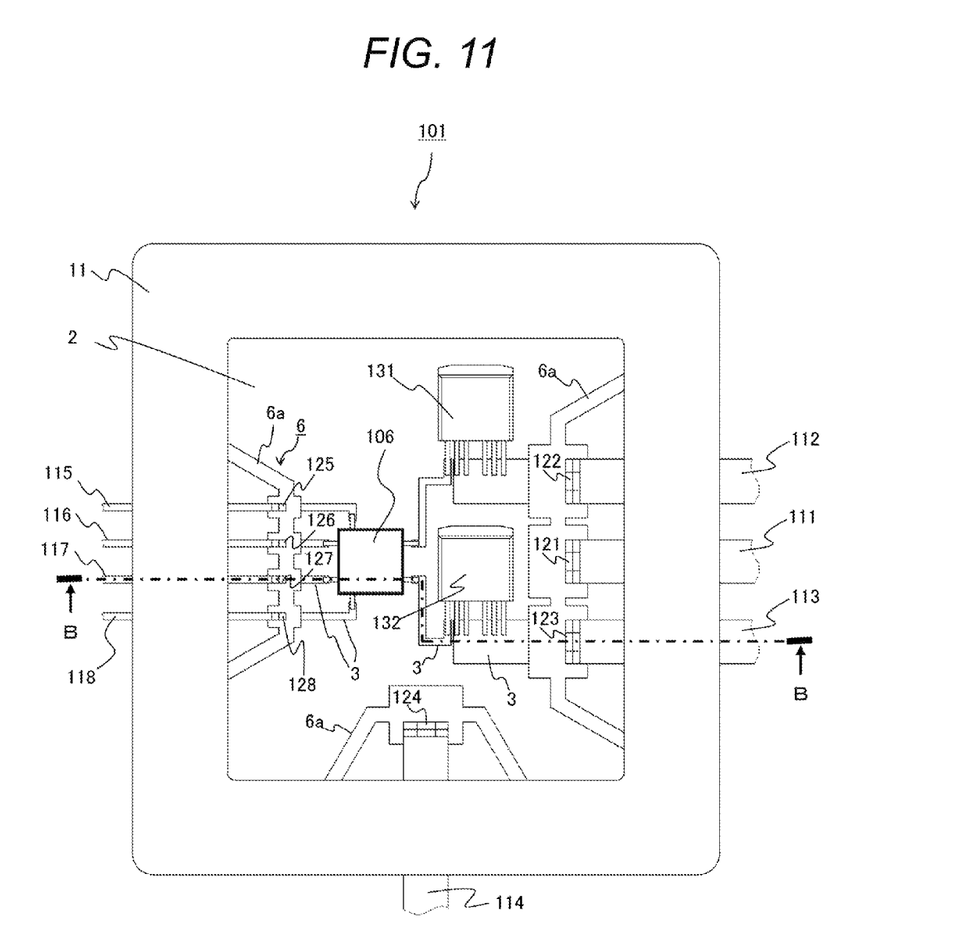
FIG. 11 is a plan view of the power semiconductor module illustrated in FIG. 10.
Figure 12:
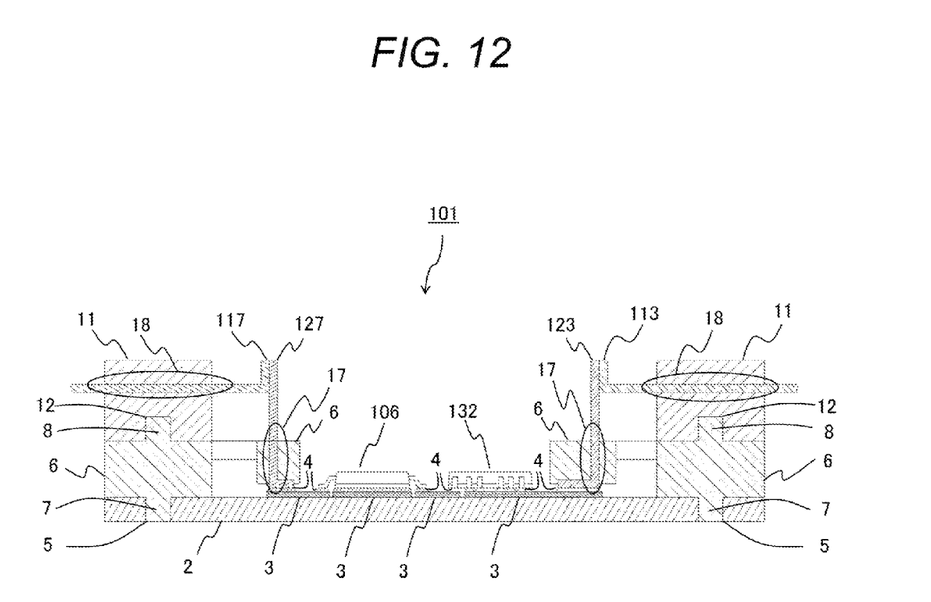
FIG. 12 is a cross-sectional view illustrating B-B cross-section of FIG. 11.

FIG. 11 is a plan view of the power semiconductor module 101 illustrated in FIG. 10, and FIG. 12 is a cross-sectional view illustrating a B-B cross-section of FIG. 11.

In FIG. 12, the semiconductor switch 132 is connected onto the substrate 2 via the wiring pattern 3 and the solder 4, and is connected to the relay terminal 123 and the external connecting terminal 113 of the power system via the wiring pattern and the solder 4. The external connecting terminal 113 is connected to the starter motor 103 (FIG. 10).

In addition, the starter control unit 106 is connected onto the substrate 2 via the wiring pattern 3 and the solder 4, and is connected to the relay terminal 127 and the external connecting terminal 117 of the signal system via the wiring pattern 3 and the solder 4 in FIG. 12. The external connecting terminal 117 is connected to the engine control unit 107 (FIG. 10).

According to the embodiment, the through hole 5 provided in the substrate 2 and the convex section 7 provided in the relay terminal holding member 6 are engaged with each other, and the relay terminals 121, 122, 123 and 124 of the power system and the relay terminals 125, 126, 127 and 128 of the signal system are fitted with the fitting sections 17 of the relay terminal holding member 6.

Accordingly, the relay terminals 121, 122, 123 and 124 of the power system and the relay terminals 125, 126, 127 and 128 of the signal system are disposed in predetermined positions without causing any positional deviation when being mounted to the substrate 2 by the solder reflow.

In addition, the relay terminals 121, 122, 123 and 124 of the power system and the relay terminals 125, 126, 127 and 128 of the signal system are fitted with the fitting sections 17 so as to be defined in optimal positions at the time of being joined respectively to the external connecting terminals 111, 112, 113 and 114 of the power system and the external connection terminals 115, 116, 117 and 118 of the signal system.

In addition, the convex section 8 provided in the relay terminal holding member 6 and the concave section 12 provided in the external connecting terminal holding member 11 are engaged with each other. Further, the external connecting terminals 111, 112, 113 and 114 of the power system and the external connection terminals 115, 116, 117 and 118 of the signal system are fitted with the fitting sections 18 of the external connecting terminal holding member 11 so as to be defined in optimal positions at the time of being joined respectively to the relay terminals 121, 122, 123 and 124 of the power system and the relay terminals 125, 126, 127 and 128 of the signal system.

As described above, the relative positional accuracy between the relay terminals 121, 122, 123 and 124 of the power system and the relay terminals 125, 126, 127 and 128 of the signal system, and the external connecting terminals 111, 112, 113 and 114 of the power system and the external connection terminals 115, 116, 117 and 118 of the signal system increases according to this embodiment. Thus, there is no need of forcibly bending and positioning the relay terminals 121, 122, 123 and 124 of the power system and the relay terminals 125, 126, 127 and 128 of the signal system at the time of joining the both. Further, it is possible to mitigate the stress on the soldering section, and to improve the service life of the solder. Accordingly, it is possible to provide the engine starting device with a long service life.

Incidentally, the present invention is not limited to the above-described embodiments, and includes various types of modified examples. The above-described embodiments have been described in order to allow easy understanding of the present invention, and are not necessarily limited to have the entire configuration that has been described. In addition, a part of configuration of a certain embodiment can be substituted by a configuration of another embodiment, and a configuration of a certain embodiment can be added with a configuration of another embodiment. In addition, addition, removal or substitution of another configuration can be performed with respect to a part of configuration of each embodiment.

For example, the opening sections OP1 and OP2, each of which is formed at the inner side of the bower semiconductor module 1, may be filled with resin. In this manner, it is possible to improve vibration resistance and corrosion resistance of a joining portion.

REFERENCE SIGNS LIST 1 power semiconductor module
2 substrate
3 wiring pattern
4 solder
5 through hole of substrate for engagement with relay terminal holding member
6 relay terminal holding member
7 convex section of relay terminal holding member for engagement with substrate
8 convex section of relay terminal holding member for engagement with external connecting terminal holding member
9 relay terminal of power system
10 relay terminal of signal system
11 external connecting terminal holding member
12 concave section of external connecting terminal holding member for engagement with relay terminal holding member
13 external connecting terminal of power system
14 external connecting terminal of signal system
15 through hole of substrate for engagement with external connecting terminal holding member
16 through hole of substrate for engagement with jig
17 fitting section for positioning relay terminal to be defined in a positional relationship that can be engaged with external connecting terminal
18 fitting section for positioning external connecting terminal to be defined in a positional relationship that can be engaged with relay terminal
21 jig
22 convex section of jig for engagement with substrate
23 concave section of jig for engagement with relay terminal holding member
24 convex section of external connecting terminal holding member for engagement with substrate
25 convex section of relay terminal holding member for engagement with jig 31 through hole of substrate for engagement with intermediate member
32 intermediate member
33 convex section of intermediate member for engagement with substrate
34 convex section of intermediate member for engagement with external connecting terminal holding member
35 concave section of external connecting terminal holding member for engagement with intermediate member
100 engine starting device
101 power semiconductor module
102 magnet switch
103 starter motor
104 pinion
105 ring gear
106 starter control unit
107 engine control unit
108 battery
109 ignition switch
111, 112, 113, 114 external connecting terminal of power system
115, 116, 117, 118 external connecting terminal of signal system
121, 122, 123, 124 relay terminal of power system
125, 126, 127, 128 relay terminal of signal system
131, 132 semiconductor switch
133, 134 freewheel diode

The invention claimed is:

1. A power semiconductor module comprising:
a substrate;
a relay terminal connected to the substrate via a solder;
an external connecting terminal joined to the relay terminal and in direct contact with the relay terminal;
a non-conductive relay terminal holding member to hold an end portion of the relay terminal on a side of a joined surface with the solder;
a non-conductive external connecting terminal holding member to hold the external connecting terminal; and
an intermediate member disposed between the substrate and the external connecting terminal holding member,
wherein the relay terminal holding member includes:
a first engagement section engaged with a jig that fixes the substrate at time of connecting the relay terminal and the substrate by soldering;
a fitting section fitted with the relay terminal,
the fitting section positions the relay terminal so as to be defined in a positional relationship that allows the relay terminal and the external connecting terminal to be joined with each other,
the intermediate member has a second engagement section engaged with the substrate, and
the external connecting terminal holding member has a third engagement section engaged with the intermediate member.

2. The power semiconductor module according to claim 1, wherein
the substrate and the relay terminal holding member are stacked, and
the substrate, the intermediate member, and the external connecting terminal holding member are stacked.

3. The power semiconductor module according to claim 1, wherein the intermediate member is disposed in direct contact with the substrate and the external connecting terminal holding member.

4. The power semiconductor module according to claim 1, wherein the second engagement section includes a projecting portion that projects from a bottom surface of the intermediate member and engages with the substrate.

5. The power semiconductor module according to claim 1, wherein the third engagement section includes a recessed portion into which a projecting portion that projects from an upper surface of the intermediate member and engages with the external connecting terminal holding member.

* * * * *